United States Patent [19]
Ashe

[11] Patent Number: 5,668,553
[45] Date of Patent: Sep. 16, 1997

[54] R2R DIGITAL TO ANALOG CONVERTER WITH COMMON SHUTDOWN MODE

[75] Inventor: James Ashe, Saratoga, Calif.

[73] Assignee: Analog Devices, Inc., Norwood, Mass.

[21] Appl. No.: 563,044

[22] Filed: Nov. 27, 1995

[51] Int. Cl.$^6$ ................................................ H03M 1/66
[52] U.S. Cl. ........................... 341/154; 341/144; 361/92
[58] Field of Search .......................... 341/144, 154, 341/106; 361/91–92

[56] References Cited

U.S. PATENT DOCUMENTS 5,258,758  11/1993  Sooch ................................. 341/144
5,422,807   6/1995  Mitrh et al. ........................ 364/184
5,543,794   8/1996  Kanzaki .............................. 341/61

OTHER PUBLICATIONS

Paul Horowitz, Winfield Hill, *The Art of Electronics*, Cambridge University Press, New York, 1989, pp. 142–143, 614–616–622–624 and 917–985.

"Octal 8–Bit Trim DAC with Power Shutdown", *AD8801/AD8803*, Analog Devices Brochure, 1995, pp. 1–15.

"DAC–8800 Octal 8–Bit CMOS D/A Converter", Precision Monolithics Inc. Brochure, Aug. 1989, Rev. A, pp. 1–15.

The Engineering Staff of Analog Devices, Inc., *Analog–Digital Conversion Handbook*, P T R Prentice Hall, pp. 201–206.

*Primary Examiner*—Jeffrey A. Gaffin
*Assistant Examiner*—Peguy JeanPierre
*Attorney, Agent, or Firm*—Koppel & Jacobs

[57] ABSTRACT

A digital to analog converter (DAC) includes "shut-down" circuitry that opens connections between the DAC's reference and output sections. The shutdown circuitry provides reduced power consumption while permitting the DAC's control registers to retain their values. The invention is applicable to both stand-alone DAC and analog to digital converters (ADCs) which incorporate a DAC and can be microprocessor controlled.

9 Claims, 3 Drawing Sheets

5,668,553

R2R DIGITAL TO ANALOG CONVERTER WITH COMMON SHUTDOWN MODE

BACKGROUND OF THE INVENTION

1. Field of the Invention

The invention is related to low-power mixed signal electronic circuits and in particular to power reduction for data conversion devices.

2. Description of the Related Art

Electronics systems benefit in many ways from reduced power consumption: lower operating costs, greater reliability, and the possible elimination of cooling elements such as fans to name just a few.

Reduced power consumption is particularly critical in battery-powered electronics systems. Not only does a battery-powered system benefit in all the ways just listed, reduced power consumption implies greater operating life between charges for a given battery size or, equivalently, a smaller battery may be used to obtain the same operating life between charges. The bulk and weight of a portable electronics system are severely constrained by the enduser's willingness to carry the system around. One example is the lack of acceptance of "luggable" portable computers which were available in the mid- to late- nineteen eighties, contrasted with the much greater popularity of lightweight "notebook" computers.

Similarly, extended operating life and small, lightweight packages contribute to the increased popularity of a wide variety of portable electronic processing devices such as cellular telephones, hand-held computers, data loggers, etc. Reduced power consumption plays an important role in reducing the size and weight and thereby increasing the acceptance of such systems.

Since low-power operation is especially desirable, many techniques have been employed to reduce a system's power consumption. One approach is to "power cycle" the electronic system, i.e., turn the system's power on only when necessary to perform critical operations. Because no power is consumed during the "powered down" periods, the system's average power consumption is reduced.

One problem with this approach to power conservation is that critical data, register values, instructions, etc., must either be stored within the circuit in a nonvolatile storage medium, such as erasable electrically programmable read only memory (EEPROM) or battery-backed static random access memory ("shadow RAM"), or it must be stored outside the system and reloaded when power is restored. Nonvolatile storage typically adds expense, weight and space to the circuit requirements.

Another approach to power reduction takes advantage of the widespread migration from TTL to CMOS integrated circuit technologies. Unlike TTL logic gates, CMOS gates dissipate very little power when they are in one logic state or the other; they dissipate power only when switching from one state to the other. Therefore, to reduce power consumption in CMOS circuits, switching speeds are reduced as much as design constraints will allow. An extreme form of this approach is evidenced by CMOS circuits such as microprocessors which feature "sleep" modes. In sleep mode, the system clock is shut off for whole sections of circuitry; no switching takes place and power consumption is reduced to almost nothing in that section of circuitry.

One advantage of the "sleep mode" approach over that of power cycling is that, because the power remains applied to the circuit, non-volatile storage is not required. As long as power is applied to the circuit, data, register values and instructions will remain intact. For a discussion of low-power design techniques see Paul Horowitz, Winfield Hill, *The Art of Electronics,* Second Edition, Cambridge University Press, New York, 1991 at pages 917–985 (sleep mode operation is discussed on page 975 and power switching is described on page 938).

Unfortunately, some circuits are not amenable to either power cycling or sleep mode operation. For example, an R2R digital to analog converter (DAC) switchably connects output and reference circuit sections through an resistor array. A voltage output DAC connects each input node of an R2R resistor ladder through analog switches to one of two voltage references; a current output DAC basically reverses the current flow, but both the voltage output and current output DACs would continue to dissipate power through their reference/resistor ladder circuitry even if their digital circuitry were "sleeping", i.e. not changing states. The DAC8800 is an example of a prior art voltage output DAC, the AD7541 is an example of a prior art current output DAC; both are available from Analog Devices, Inc., Norwood, Mass.

The power cycling approach to power conservation meets with its own problems when applied to R2R DACs. The DACs typically include an interface section through which data is loaded into the registers which control the DAC's switch configuration. As noted above, the registers must either be preserved or reloaded when power is restored after a "power down" cycle. Reloading the registers can be a time-consuming operation, especially if there are several registers and if the interface is a serial interface. Preserving the registers through the use of nonvolatile storage is often impractical for the reasons noted above.

There is thus a need for a DAC which preserves register values within its control section, and reduces the amount of power consumed by the its reference/output section, without removing power from the converter circuit and without employing storage for the register values.

SUMMARY OF THE INVENTION

The invention is directed to a DAC which permits a reduction of power consumption within its reference/output section while retaining information in its control circuit section.

The new DAC includes circuitry that, in response to the activation of a control signal, places the path between its reference and output sections in a high impedance state, thereby reducing the DAC's power consumption. When activated, the control circuitry turns off analog switches which, in normal operation, connect the reference and output sections, thereby imposing high impedances in the paths between the reference and output sections.

The invention is intended for use not only in standalone DACs, but also in analog to digital converters (ADCs) such as successive approximation and half-flash converters, which employ DACs to convert an analog input signal into a digital output signal. Additionally, the invention may be used in electronic processing systems which employ DACs directly or indirectly through the use of ADCs. The invention's power-saving feature makes it particularly suitable for low-power, battery-powered electronic processing systems.

Because the invention significantly reduces a DAC's power consumption without "powering down", register information is retained without using nonvolatile register storage or requiring the reloading of registers when power is restored. Furthermore, because the registers remain fully operational when the reference/output section is in its reduced-power mode, the register values may be changed during a low-power period.

These and other features, aspects and advantages of the invention will be apparent to those skilled in the art from the following detailed description and accompanying drawings.

DETAILED DESCRIPTION OF THE INVENTION

Figure 1:
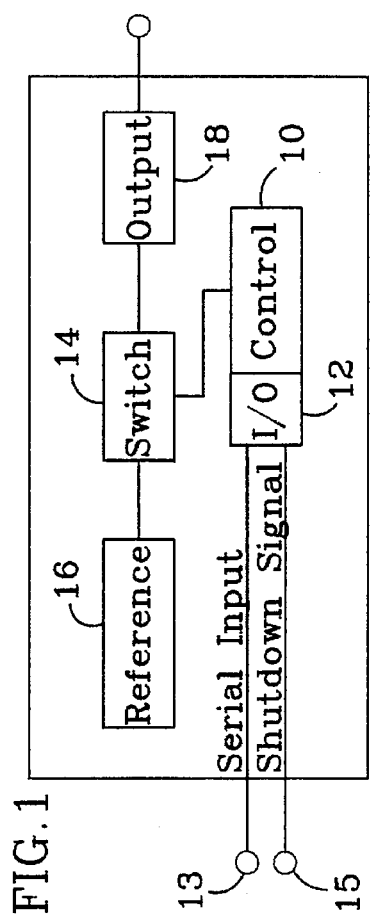
FIG. 1 is a block diagram of an R2R DAC that uses the invention.

The DAC block diagram of FIG. 1 is applicable to both voltage output and current output DACs. It includes a control block 10 with a digital input/output (I/O) section 12 through which the control block 10 accepts data and command information. In one single chip integrated circuit (IC) implementation the I/O path is serial, with an interface which includes the input labeled serial 13. Serial I/O reduces the number of pins and internal runs dedicated to the data path, thus permitting a reduction in package size or an increase in functionality for the same package size.

The control block 10 adjusts switches within a switch block 14 to link a reference block 16 to an output block 18 in response to commands received through the digital I/O section 12. The reference block 16 provides stable, accurate voltage or current references, portions of which are summed in the output block 18 to provide an "analog" output. The switch block 14 determines the magnitude of the analog output by switching various portions of the references into the output block 18 for summing. That is, the analog output corresponds to the combinatorial value of the digital input. For example, a digital value of 11111111 within the control block 10 may adjust the switches within the switch block 14 to produce the highest analog output possible from the DAC, e.g. 5V, and a digital value of 00000000 may produce the lowest output available, e.g. 0V. The control block 10 also adjusts the switch block 14 to reduce power consumption in response to activation of a shutdown signal 15. The shutdown input 15, when activated, initiates a power-saving mode of operation within the DAC which opens, or turns off, all of the switches in the switch block 14, thereby significantly reducing power consumption without depriving the DAC of power or of the operability of its control block 10.

Figure 2:
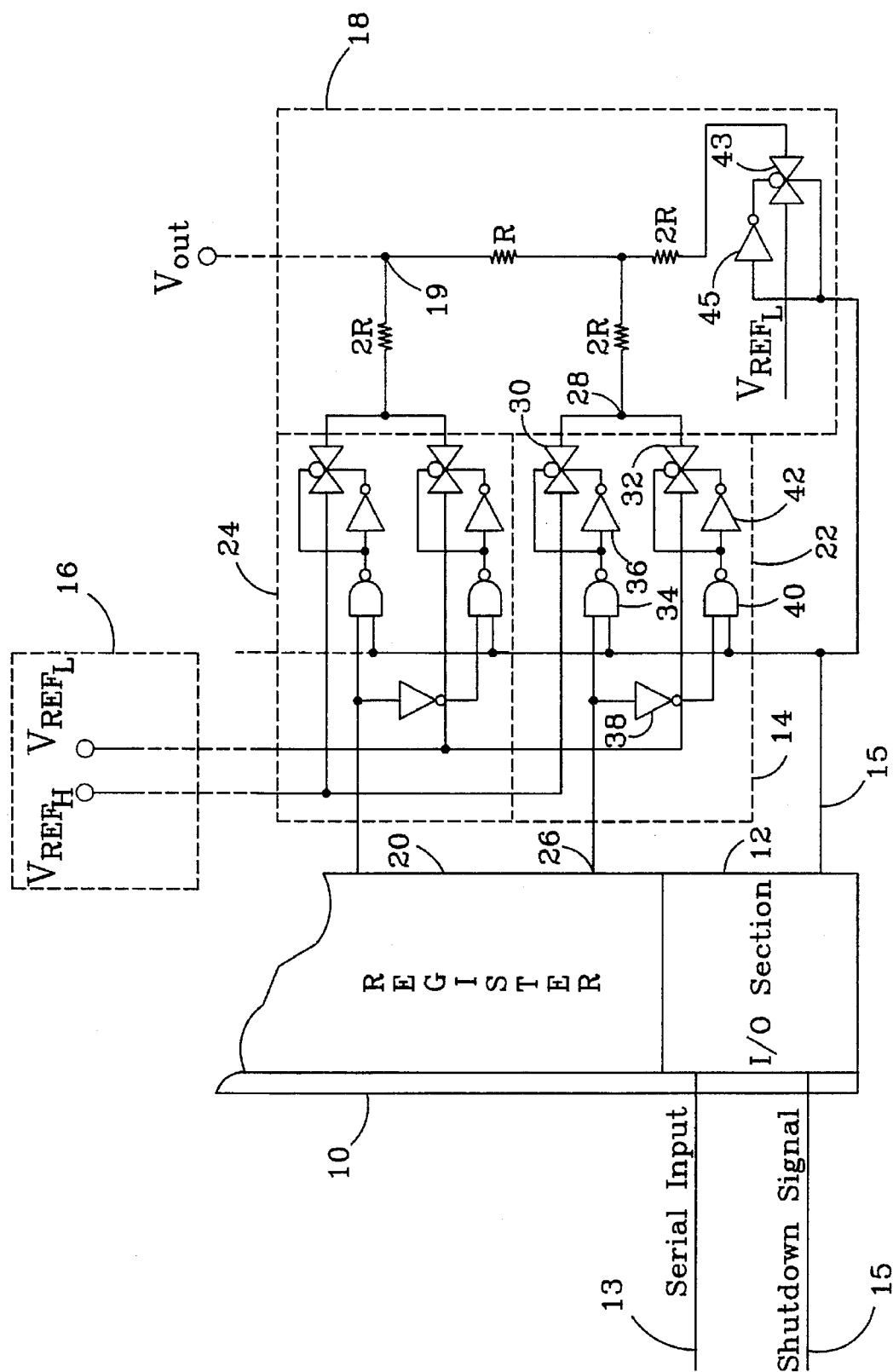
FIG. 2 is a schematic diagram of a voltage output R2R DAC which illustrates the DAC's switch control circuitry in detail.

FIG. 2 illustrates a voltage output DAC implementation of the invention. An I/O section 12 of a control block 10 loads registers 20, according to commands received through a serial input 13. Outputs from the registers 20 control the configuration of the switch groups 22, 24, etc., which comprise the switch block 14. In this way, the control block 10 controls the connections between the voltage references $V_{refH}$ and $V_{refL}$ and an output block 18.

The output block 18 consists of an R2R ladder 19, each input node of which is connected through the switch block 14 to either $V_{refH}$ or $V_{refL}$. Typical values for $V_{refH}$ and $V_{refL}$ are 5V and 0V, respectively. The DAC's analog output voltage $V_{out}$ takes on values which correspond to the combinatorial value of binary signals stored within the registers 20. For example, $V_{out}$ is highest with all the input nodes connected to the high reference $V_{refH}$, lowest with all the input nodes connected to the low reference $V_{refL}$, and it takes on intermediate values for other combinations within the registers. For a discussion of R2R ladders and their application to DACs, see Paul Horowitz, Winfield Hill, *The Art of Electronics*, Second Edition, Cambridge University Press, New York, 1991, pp 614–616.

A detailed discussion of the switch group 22, which connects input node 28 of the output block 18 to the reference block 16, will serve to explain the detailed operation of this embodiment of the invention. The register output 26 is the least significant bit of the DAC. The switch group 22 includes two analog switches 30 and 32 which are disposed between $V_{refH}$ and the input node and $V_{refL}$ and the input node 28, respectively. In the active mode (with SHUTDOWN input 25 at a logic HIGH level) one and only one of the analog switches 30 and 32 within the switch group 22 is turned on at a time. In this way, the input node is connected to either $V_{refH}$ or $V_{refL}$.

An analog switch is, basically, a four port device. Two of the ports are dedicated to control; each switch features an active LOW and an active HIGH control input. When a logic LOW value is applied to a switch's LOW input control and a logic HIGH is applied to its HIGH input control, an analog switch provides a bidirectional low impedance path for analog signals between its remaining two ports. Analog switches are known in the art, see Paul Horowitz, Winfield Hill, *The Art of Electronics*, Second Edition, Cambridge University Press, New York, 1991, pp 142–143.

The active LOW control input of analog switch 30 is connected to the output of a NAND gate 34 which has as its inputs the register output 26 and the SHUTDOWN signal 15. If both the inputs to the NAND gate 34 are HIGH its output is low, as is the active LOW control input to the analog switch 30. The output of the NAND gate 34 is also connected to the input of an inverter 36, the output of which is connected to the active HIGH input of the analog switch 30. Thus, when either input of the NAND gate 34 is low, the active LOW input of the analog switch 30 is HIGH and the active HIGH input of the analog switch 30 is LOW and, consequently, the analog switch is in a high impedance state. Conversely, when both inputs of the NAND gate 34 are HIGH, the analog switch 30 provides a low impedance path between $V_{refH}$ and the output node 28.

Similarly, the active LOW control input of the analog switch 32 is connected to the output of a NAND gate 40, its active HIGH control input is connected through an inverter 42 to the output of the same NAND gate. The inputs to the NAND gate 40 are the SHUTDOWN signal and the register output 26 which has been inverted by the inverter 38.

For example, if the register output 26 is HIGH, the output of the NAND gate 34 is LOW, as is the active LOW control input of the analog switch 30. The inverter 36 inverts the output of the NAND gate 34; the active high input of the analog switch is therefore HIGH and the analog switch 30 is "ON", thereby providing a low-impedance path between $V_{refH}$ and the input node 28. Similarly, because the register output 26 is HIGH, the inverter 38 inverts the input to the NAND gate 40, the output of which is therefore HIGH, as is the active low input to the analog switch 32. The inverter 42 inverts the output from NAND gate 40, presenting a LOW to the active high analog switch 32 input and the analog switch 32 is "OFF", thereby opening the circuit between $V_{refL}$ and the input node 28.

Assume now that the register output 26 is LOW. The output of NAND gate 34 is HIGH, as is the active low input to the analog switch 30, and the inverter 36 provides a LOW input to the active high input of the analog switch 30. The analog switch 30 is therefore "OFF" and the path between the reference $V_{refH}$ and the input node 28 is open. Since the inverter 38 provides a HIGH input to the NAND gate 40, the output of the NAND gate 40 is LOW, as is the active low input to the analog switch 32, and the inverter 42 provides a HIGH input to the active high input of the analog switch 32. The analog switch 32 is therefore "ON" and provides a low impedance path between the reference $V_{refL}$ and the input node 28.

In the active mode, i.e. when the SHUTDOWN input 15 is HIGH, there is thus always one switch in each switch group that is "ON" and provides a low impedance path between a reference and an input node.

In the shutdown mode, on the other hand, the shutdown input 15, which is distributed to the NAND gates 34, 40, is LOW. Consequently the output of each NAND gate 34, 40 is HIGH, as is the input to the active low input of each analog switch 30, 32. Furthermore, because of the inverters 36, 42 the active HIGH input of each of the analog switches 30, 32 is LOW. Thus, whenever the SHUTDOWN input is LOW, both the analog switches 32, 32 are "OFF", the paths from both reference voltages to the input node 28 is open, and no current flows between the reference block 16 and the output block 18. In this way, all of the switch groups 22, 24 . . . in the switch block 14, one for each register bit, are placed in the high impedance state by one SHUTDOWN signal 15. Additionally, an analog switch 43 connects the "bottom" of the R2R ladder 19 to $V_{refL}$ and is placed in a high impedance state by the activation of the SHUTDOWN signal. That is, the active LOW control input of the switch 43 is connected through an inverter 45 to the SHUTDOWN signal, and the active HIGH input of the switch 43 is connected directly to the SHUTDOWN signal.

As indicated above, in the shutdown mode, although the reference/output circuitry power consumption is greatly reduced, the registers 20 remain in operation. They may retain their contents without reloading, which may be of great benefit if there are several DACs located on a single integrated circuit. Alternatively, they may be reloaded while the DACs are in the shutdown mode, permitting a sort of "pipelining" of DAC operation whereby an analog output is produced and, rather than waiting for reactivation of the output block, the registers 20 are reloaded in anticipation of the next-required analog output.

Figure 3:
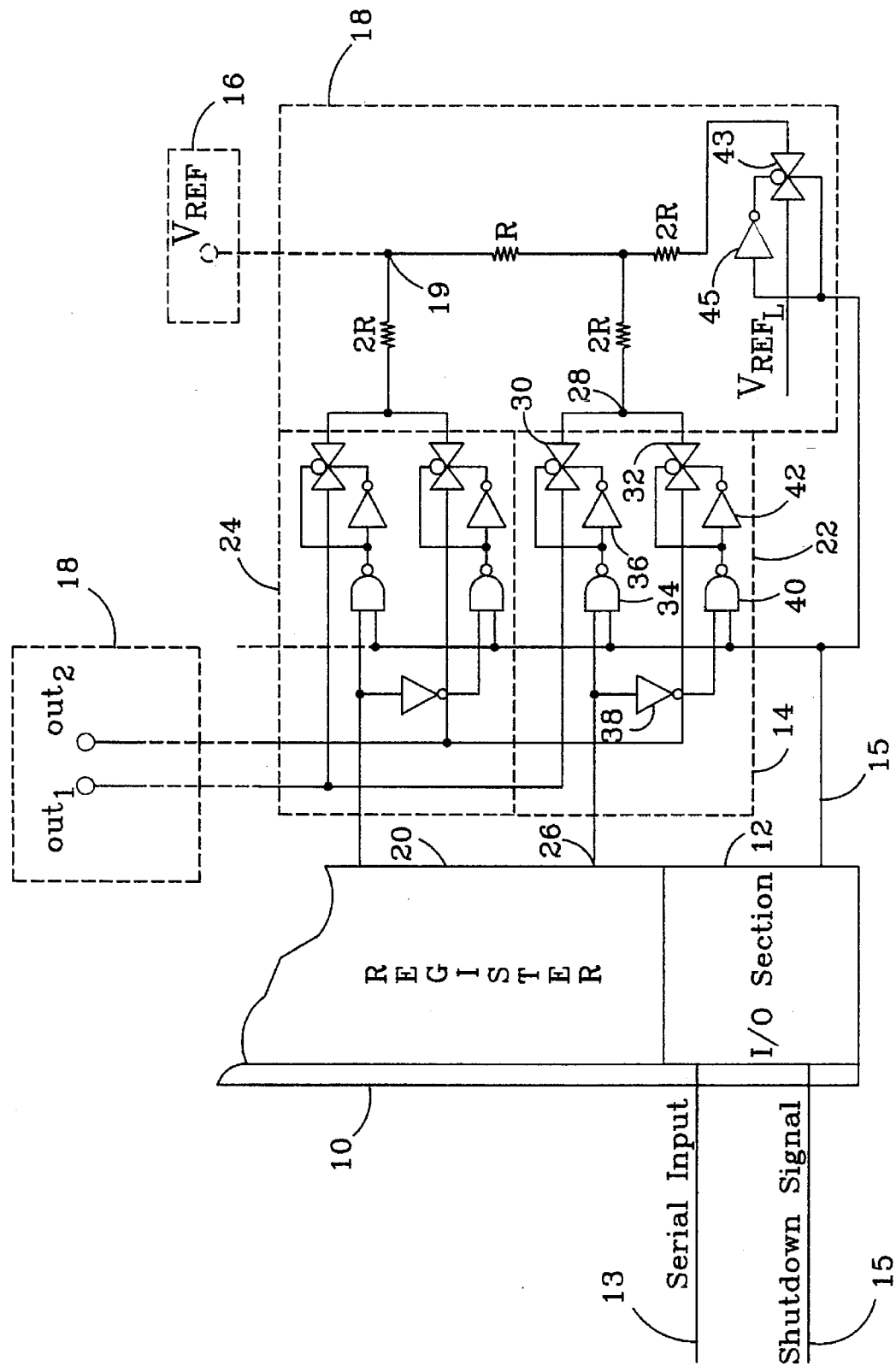
FIG. 3 is a schematic diagram of a current output R2R DAC which illustrates the DAC's switch control circuitry in detail.

The current output DAC of FIG. 3 operates in much the same manner as the voltage output DAC of FIG. 2. The switch groups 22, 24 . . . , registers 20, I/O 12, switch 43 and R2R ladder 19 are identical. However, a single reference voltage $V_{ref}$ supplies an input to the R2R ladder 19 and current flows from the R2R ladder into one of two current outputs $out_1$ or $out_2$, under control of the switch groups 22, 24 et al. The output and reference sections 18 and 16 are basically reversed. As with the voltage output DAC, the shutdown signal "opens" all the switches in the switch group, thereby significantly reducing current flow between the output and reference sections. In the current output implementation analog switch 43 imposes a high impedance path between $out_2$ and the "bottom" of the R2R ladder 19 when it is "opened" by activation of the SHUTDOWN input 15.

Figure 4:
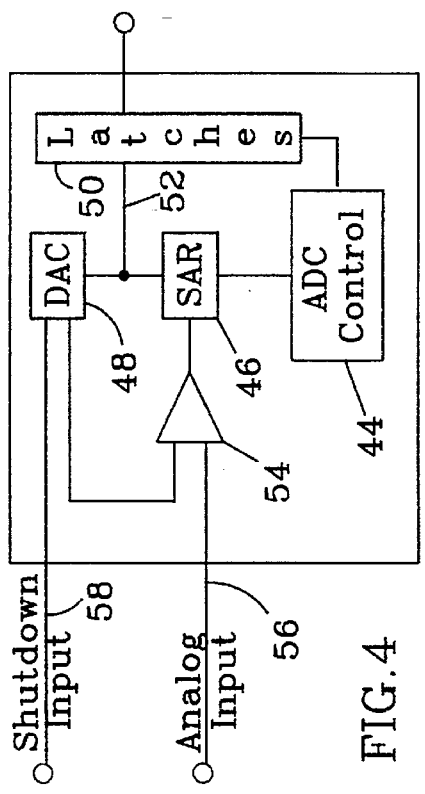
FIG. 4 is a block diagram which illustrates the incorporation of the new DAC in a successive approximation ADC.

FIG. 4 is a block diagram of a successive approximation ADC which incorporates the invention. Briefly, an ADC control block 44 controls the digital value held by a successive approximation register 46 (SAR). This value is sent to a DAC 48 and to output latches 50 via a data path 52, which in this implementation is a parallel data path. The ADC control block 44 also controls the latching of outputs from the SAR 46 into the output latches 50. The DAC 48 produces an analog signal corresponding to the digital value from the SAR 46 and provides the signal to a comparator 54. The comparator 54 compares this signal to an analog voltage which is to be converted to digital form and is present at the ADC's analog input 56.

The output of the comparator 54 provides feedback to the SAR 46, which alters its digital output in response and thus successively approximates the value of the analog input, until the output of the DAC 48 matches the analog input. When this happens the corresponding final value of the SAR 46 is latched into the output latch 50. A SHUTDOWN input 58 performs as described in connection with the discussion of the previous FIGS, i.e., when activated it "opens" the path between reference and Output sections within the DAC. Successive approximation ADCs are known in the art; for a discussion of them see Paul Horowitz, Winfield Hill, *The Art of Electronics*, Second Edition, Cambridge University Press, New York, 1991, pp 622–624.

Figure 5:
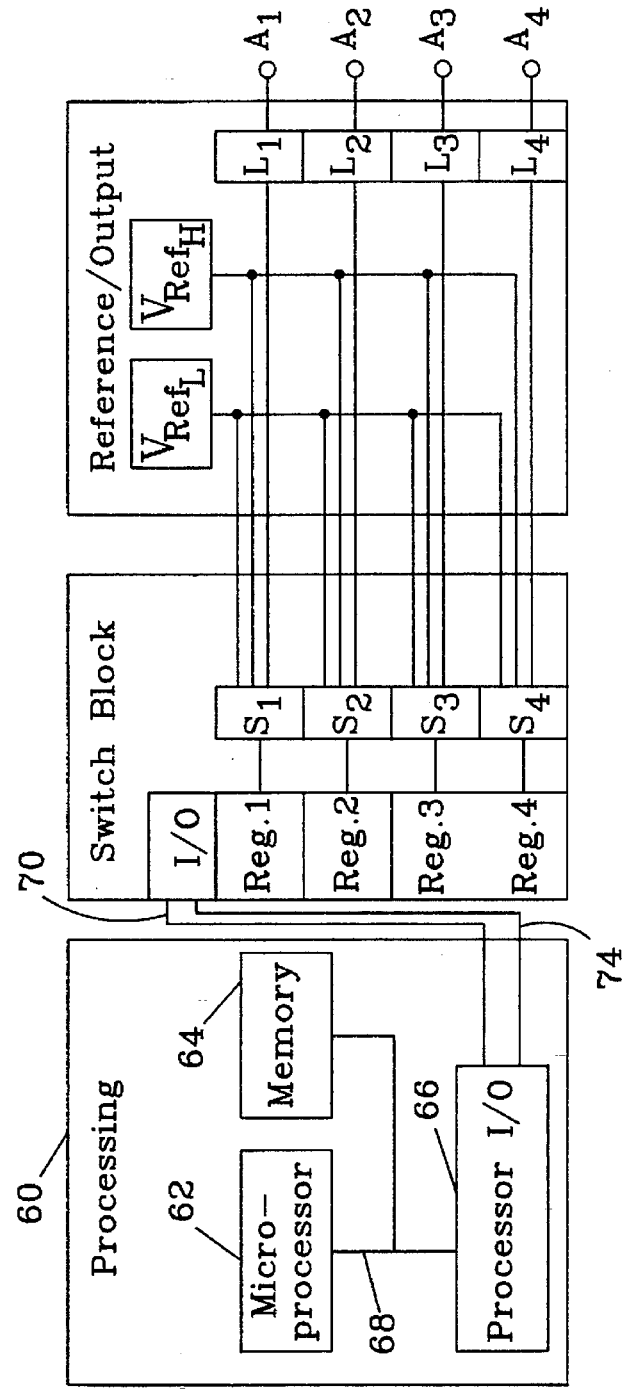
FIG. 5 is a block diagram of an electronic processing system which incorporates the invention.

An electronic processing system which incorporates the invention is depicted in block diagram form in FIG. 5. The processing system includes a processing section 60 which, in addition to its end-user functions, controls the interconnection of a reference/output section through the configuration of the switch block 14. The processing section 60 includes a microprocessor 62, a memory 64 from which the microprocessor 62 retrieves data and instructions and a processor I/O section 66 used by the microprocessor 62 to communicate with, among other things, the switch block 14. The microprocessor 62, memory 64, and processor I/O section 66 are linked by an internal data bus 68 through which they exchange data, instructions and commands.

In this implementation, the processing block 60 communicates with the switch block 14 through a serial link 70 between the processor I/O 66 and the switch block I/O 72. In addition to the I/O 72, the switch block 14 includes four registers Reg1, Reg2, Reg3 and Reg4 which determine the settings of switch groups S1, S2, S3 and S4, respectively, within the switch block 14. The switch groups S1, S2, S3 and S4 connect the references $V_{refL}$ and $V_{refH}$ to the R2R ladders L1, L2, L3 and L4 as previously described. Each R2R ladder provides an analog output, A1, A2, A3 and A4 which varies according to the configuration of its respective switch array: S1, S2, S3 and S4. The SHUTDOWN signal line 74 opens all the switches within the switch arrays S1–S4 when asserted under control of the microprocessor 62.

The forgoing description of specific embodiments of the invention has been presented for the purposes of illustration and description. It is not intended to be exhaustive or to limit the invention to the precise forms disclosed, and many modifications and variations are possible in light of the above teachings.

For example, the physical implementation of the electronic processing system could take on many forms; the entire system could be constructed within a single integrated circuit, on a single printed circuit board, or distributed throughout several circuit boards. Control of the shutdown mode may be exercised directly i.e., without intervention of the microprocessor, through a human interface or under control of another, system-wide shutdown signal. The SHUTDOWN signal may be an active HIGH signal and the shutdown circuitry could be implemented using other logic schemes such as NOR logic. The processing system could be based upon a microprocessor or a microcontroller.

The DACs may be used to provide digital gain control or to implement a four quadrant multiplying DAC and the ADCs may be used to sense physical phenomena such as temperature, voltage or pressure.

The embodiments were chosen and described in order to best explain the principles of the invention and its practical application, and to thereby enable others skilled in the art to best utilize the invention. It is intended that the scope of the invention be limited only by the claims appended hereto.

I claim:

1. A digital to analog converter having a reduced power mode of operation, comprising:
    a reference circuit which provides stable, accurate electrical references,
    an output circuit having input nodes which provides an analog output signal,
    a switch circuit which selectively connects said reference circuit to said output circuit nodes,
    a control circuit which controls said connection of said reference and output circuits, said connection corresponding combinatorially to digital values stored within said control circuit, and
    a power reduction input, said control circuit being responsive to activation of the power reduction input by entering a reduced power mode of operation effected by disconnecting the reference circuit from the output circuit, thereby eliminating drive to said output circuit and substantially reducing current flow from said electrical reference.

2. The digital to analog converter of claim 1, wherein the switch circuit comprises CMOS analog switch groups, each of which includes two analog switches having a total of four poles, with one pole of each analog switch connected to a respective reference and with the remaining pole of each switch connected to the same input node of the output circuit, and a control input connected to turn both switches off in said reduced power mode.

3. The digital to analog converter of claim 2, wherein each switch group comprises two analog switches, only one of which is enabled to be turned on at a given time in correspondence with the state of a control signal.

4. The digital to analog converter of claim 3, wherein each analog switch is connected to the power reduction input and is turned off in response to the activation of said power reduction input.

5. The digital to analog converter of claim 1, wherein said output circuit comprises an R2R ladder, the switch circuit comprises switch groups with one switch group associated with each input node of said R2R ladder, and each switch group selectively connects one of said references to its associated input node during normal operation.

6. The digital to analog converter of claim 5, wherein the control circuit opens all the switches within a switch group in response to activation of the power reduction input, thereby placing the paths between said reference and output circuits in a high impedance state during said reduced power mode.

7. An analog to digital converter having a low power mode of operation, comprising:
    an analog input circuit having an analog input,
    a digital output circuit,
    a digital to analog converter connected to the digital output section to be loaded thereby with digital values from the digital output circuit, and
    a comparison circuit connected to compare the output of the digital to analog converter with the analog input of the analog to digital converter and to provide a comparison output signal which adjusts the digital output circuit so that the analog output from the digital to analog converter conforms to the analog input of the analog to digital converter,
    said digital to analog converter comprising:
        a reference circuit which provides stable, accurate electrical references,
        an output circuit which provides an analog output signal said output circuit selectively connected to said reference circuit,
        a switch circuit which selectively connects said reference circuit to said output circuit,
        a control circuit which controls said connection of said reference and output circuits, said connection corresponding combinatorially to digital values stored within said control circuit, and
        a power reduction input, said control circuit being responsive to activation of the power reduction input by entering a reduced power mode of operation effected by disconnecting the reference circuit from the output circuit, thereby eliminating drive to said output circuit and substantially reducing current flow from said electrical reference.

8. An electronic processing system having a low power mode of operation, comprising:
    a microprocessor,
    a memory circuit connected to the microprocessor to provide storage and access to data and commands for the microprocessor,
    an input/output system operationally connected to receive an output from, and to provide an input to, said microprocessor, and
    a digital to analog converter connected to receive a digital output from said input/output system and to convert it to an analog format,
    said digital to analog converter comprising:
        a reference circuit which provides stable, accurate electrical references,
        an output circuit which provides an analog output signal said output circuit selectively connected to said reference circuit,
        a switch circuit which selectively connects said reference circuit to said output circuit,
        a control circuit which controls said connection of said reference and output circuits, said connection corresponding combinatorially to digital values stored within said control circuit, and
        a power reduction input, said control circuit being responsive to activation of the power reduction input by entering a reduced power mode of operation effected by disconnecting the reference circuit from the output circuit, thereby eliminating drive to said output circuit and substantially reducing current flow from said electrical reference.

9. An electronic processing system having a low power mode of operation, comprising:
    a microprocessor,
    a memory circuit connected to the microprocessor to provide storage for data and commands for use by the microprocessor, an input/output system operationally connected to receive output from said microprocessor and to send input to said microprocessor, and an analog to digital converter connected to receive commands from said microprocessor, said analog to digital converter comprising:
- an analog input circuit,
- a digital output circuit,
- a digital to analog converter connected to the digital output section to thereby be loaded with digital values from the digital output circuit, and
- a comparison circuit connected to compare the output of the digital to analog converter with the input of the analog to digital converter and to provide a comparison output signal which adjusts the digital output section so that the output of the digital to analog converter conforms with the input of the analog to digital converter, said digital to analog converter comprising,
a reference circuit,
an output circuit selectively connected to the reference circuit by a switch circuit,
a power reduction input, and
a control circuit which controls the selective connection of said reference and output circuits, and is responsive to activation of the power reduction input by entering a reduced power mode of operation effected by disconnecting the reference circuit from the output circuit, thereby eliminating drive to said output circuit and substantially reducing current flow from said reference circuit.

* * * * *